United States Patent [19]

Takeuchi et al.

[11] Patent Number: 4,558,427
[45] Date of Patent: Dec. 10, 1985

[54] SHEET-LIKE COMPACT ELECTRONIC EQUIPMENT

[75] Inventors: Eiichi Takeuchi, Iruma; Kazuya Hara, Tokyo, both of Japan

[73] Assignee: Casio Computer Co., Ltd., Tokyo, Japan

[21] Appl. No.: 468,401

[22] Filed: Feb. 22, 1983

[30] Foreign Application Priority Data

| Mar. 3, 1982 [JP] | Japan | 57-33272 |
| Mar. 3, 1982 [JP] | Japan | 57-33273 |
| Mar. 3, 1982 [JP] | Japan | 57-33274 |

[51] Int. Cl.⁴ .............................................. G06F 15/02
[52] U.S. Cl. .................................................... 364/708
[58] Field of Search .............................. 364/708, 712

[56] References Cited

U.S. PATENT DOCUMENTS

| 4,075,702 | 2/1978 | Davies | 364/708 |
| 4,081,898 | 4/1978 | Taylor, Jr. et al. | 29/622 |
| 4,104,728 | 8/1978 | Kasubuchi | 364/708 |
| 4,158,230 | 6/1979 | Washizuka et al. | 364/708 |
| 4,197,586 | 4/1980 | Nidiffer | 364/708 |
| 4,209,735 | 6/1980 | Yoshida | 364/708 |
| 4,264,962 | 4/1981 | Kodaira | 364/708 |

FOREIGN PATENT DOCUMENTS 2633884 5/1977 Fed. Rep. of Germany .

*Primary Examiner*—David H. Malzahn
*Attorney, Agent, or Firm*—Frishauf, Holtz, Goodman & Woodward

[57] ABSTRACT

A sheet-like compact electronic device includes an electronic parts assembly in which a semiconductor integrated circuit chip, a display element and a dry cell are arranged on a sheet-like board. The electronic parts assembly is flexible and is sandwiched between a sheet-like upper cover and a sheet-like lower cover. The upper cover is flexible and has a display window, and the lower cover is also flexible and has a flat lower surface.

16 Claims, 44 Drawing Figures

F I G. 4
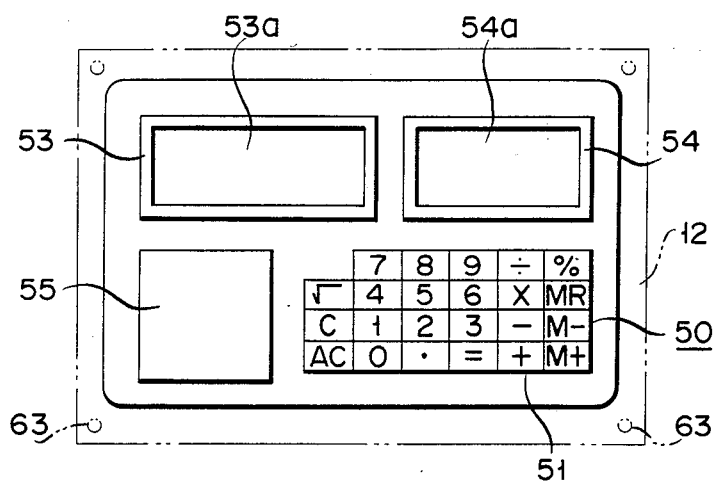
F I G. 5
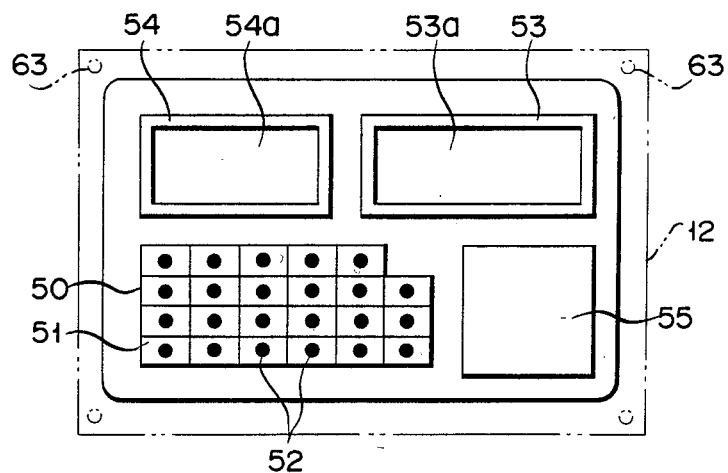

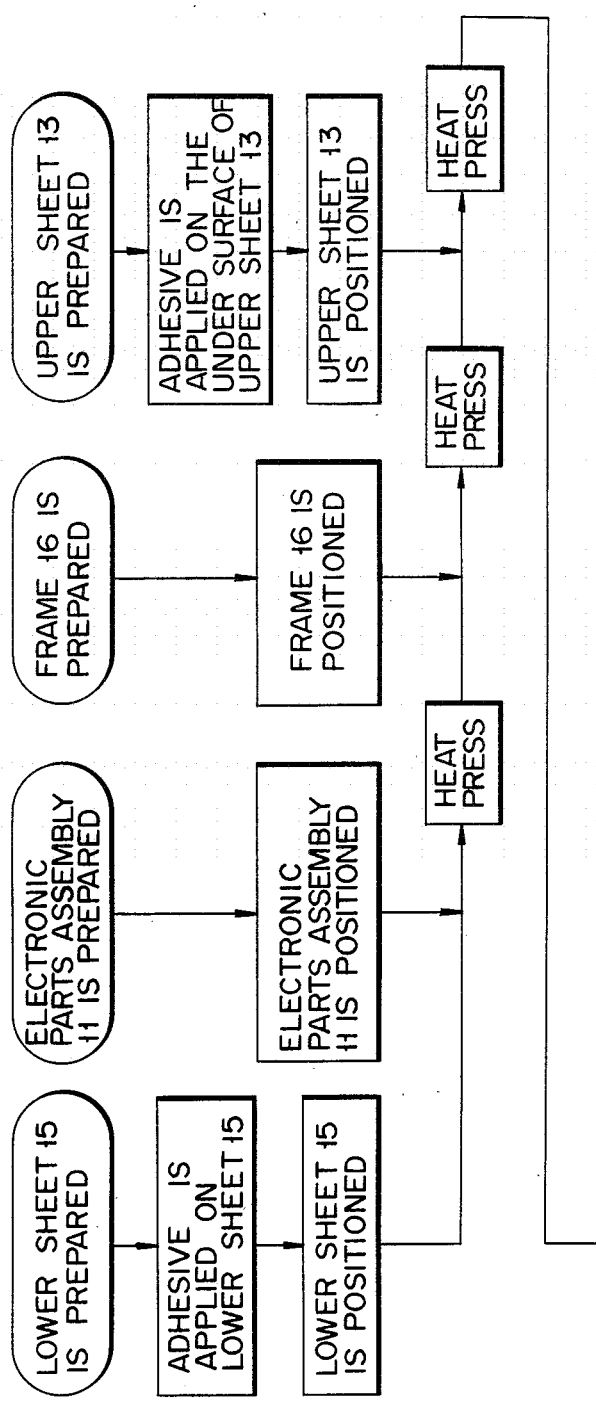

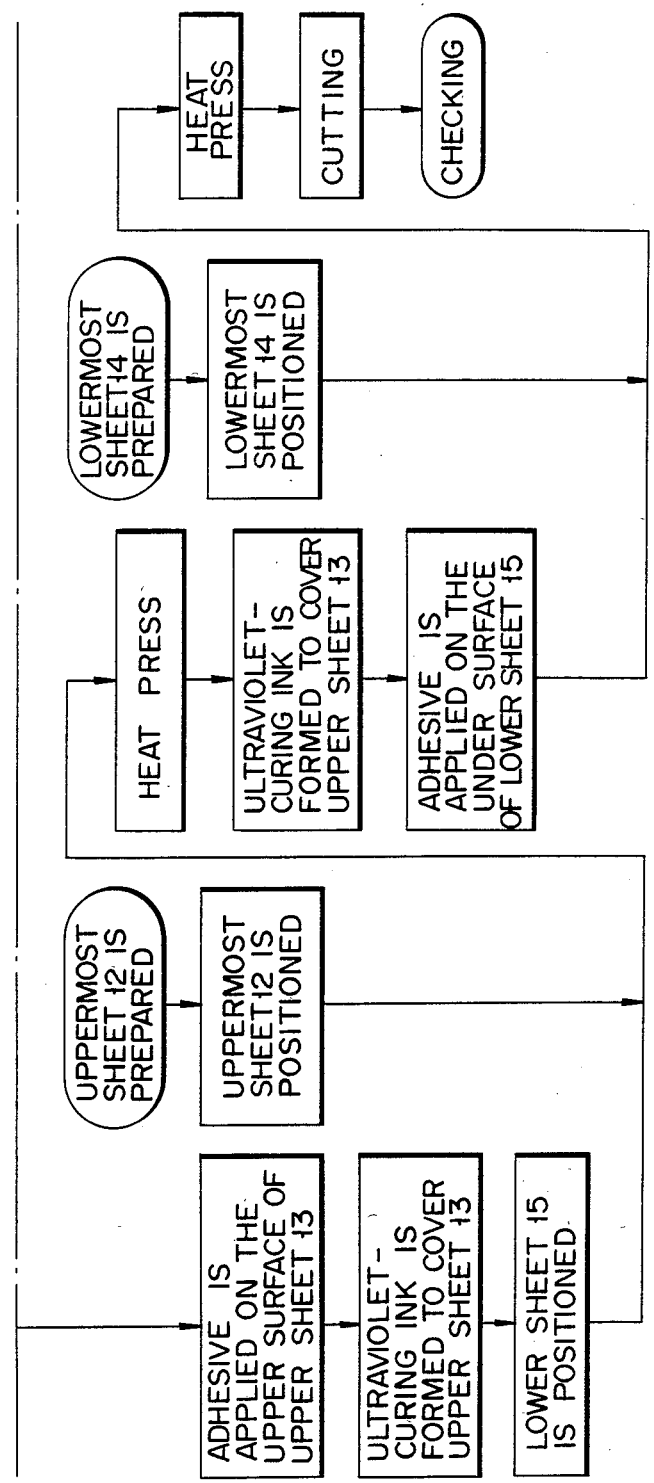

FIG. 25
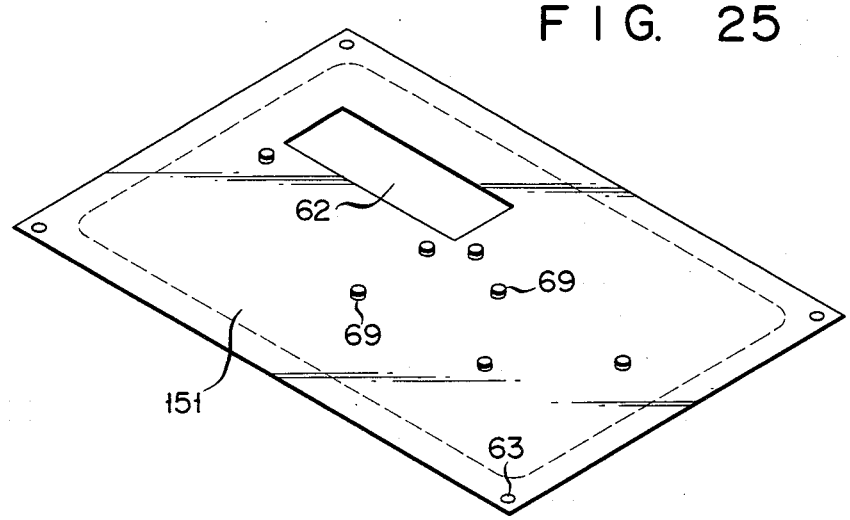
FIG. 26
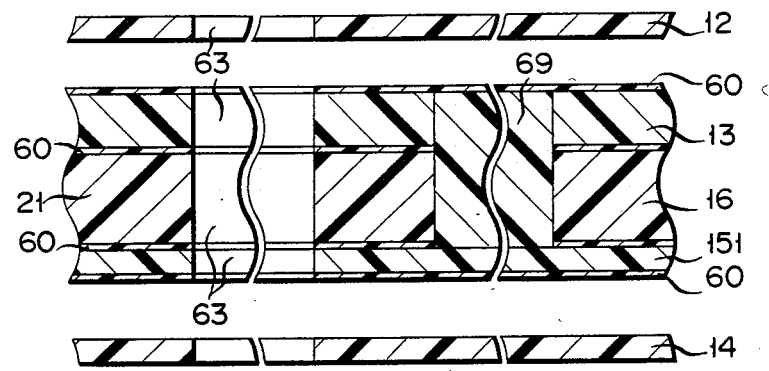
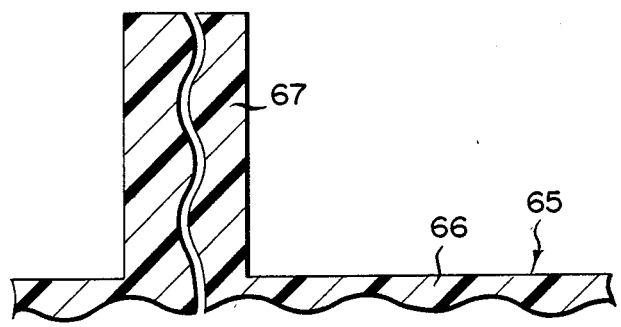

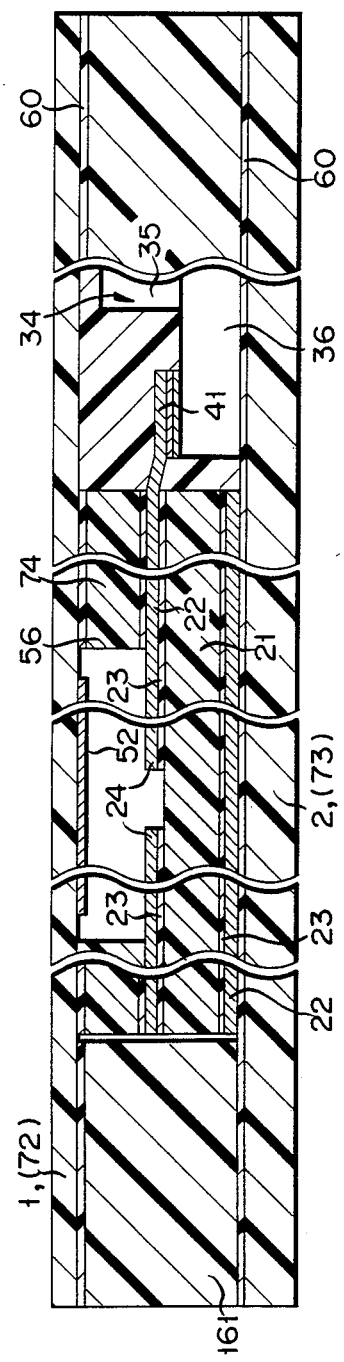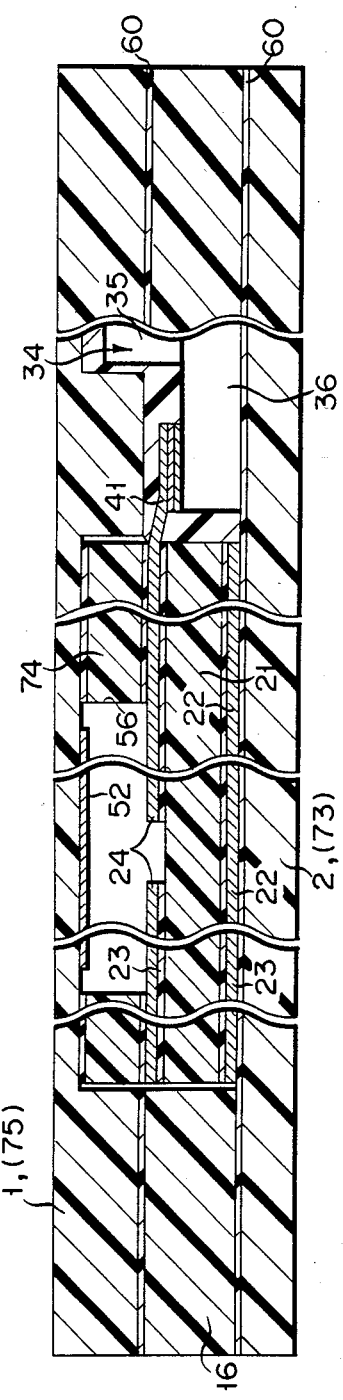

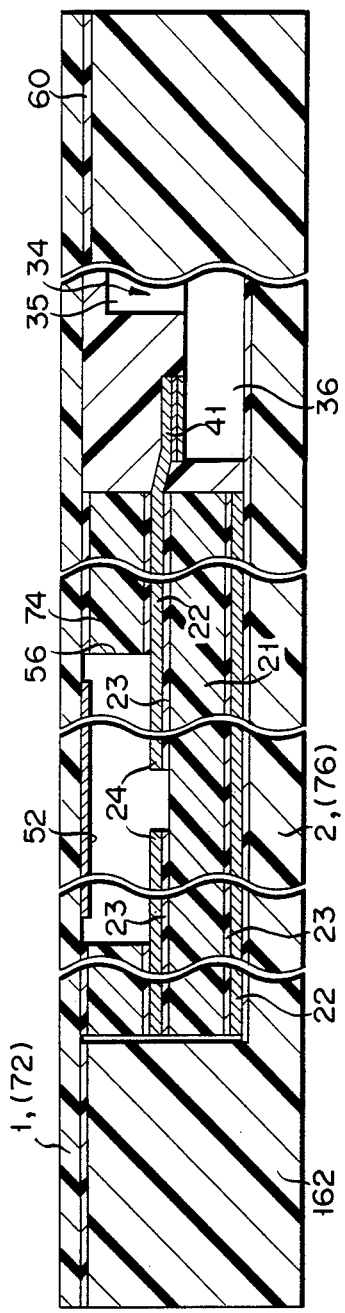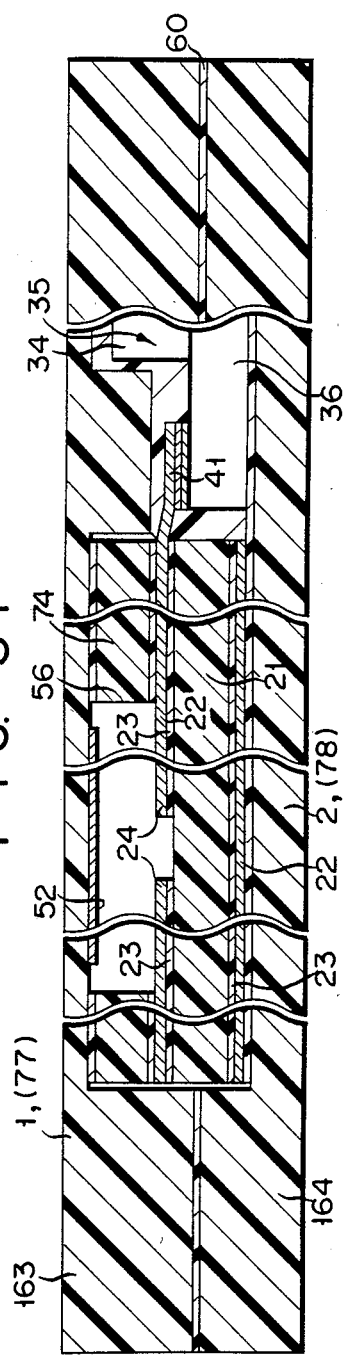

SHEET-LIKE COMPACT ELECTRONIC EQUIPMENT

BACKGROUND OF THE INVENTION

The present invention relates to sheet-like compact electronic devices having a small thickness (e.g., 1 mm or less).

In the latest compact electronic devices such as an electronic calculator, a compact electronic watch and an electronic game machine, the thickness of the outer case tends to be decreased so as to improve portability.

In a portable/compact electronic calculator, for example, it is desired that the outer case be compact like a credit card and have a small thickness, and that the upper surface of the outer case be flat without any projection. In the compact electronic calculator of the type described above, a synthetic resin is conventionally used to mold an outer case which has component parts such as a wiring board, a display panel and a dry cell therein. Alternatively, the outer case is formed by a synthetic resin in combination with a metal plate.

However, the outer case must be thick enough and rigid enough to protect various component parts from an outside force. For these reasons, the thickness of the outer case cannot be smaller than 1.6 mm. As a result, the conventional compact electronic calculator cannot have a thickness of 1 mm or less, unlike the credit card. Furthermore, in most of the conventional electronic calculators or the like, a display unit and keys project from the upper surface of the outer case, thus resulting in inconvenience and degrading portability.

SUMMARY OF THE INVENTION

It is, therefore, an object of the present invention to provide a sheet-like compact electronic device which eliminates the conventional drawbacks, has an outer case with an electronic parts assembly of a flat sheet-like structure, and wherein the outer case is kept rigid although the outer case is very thin, thus resulting in convenience and improving portability.

In order to achieve the above object of the present invention, there is provided a sheet-like compact electronic device, comprising:

an electronic parts assembly including
a board including switching contacts and having a predetermined wiring pattern thereon,
a semiconductor integrated circuit chip disposed on said board and electrically connected to said wiring pattern,
a display unit disposed on said board and electrically connected to said semiconductor integrated circuit chip through said wiring pattern, said display unit being adapted to visually display data in accordance with an output signal from said semiconductor integrated circuit chip, and
a dry cell disposed on said board and electrically connected to said semiconductor integrated circuit chip through said wiring pattern, said dry cell being adapted to apply a drive voltage across said semiconductor integrated circuit chip; and
case means comprising
upper cover means made of a flexible material and in tight contact with an upper surface of said electronic parts assembly, said upper cover being provided with a key operation section opposing said switching contacts on said board so as to allow an operator to perform a key operation and with a transparent display window opposing said display section, and
lower cover means made of a flexible material, having a sheet-like flat lower surface, and in tight contact with a lower surface of said electronic parts assembly, whereby said case means stores said electronic parts assembly therein such that said upper and lower cover means sandwich said electronic parts assembly therebetween.

In the sheet-like compact electronic device having the structure described above, the upper and lower covers are respectively brought into tight contact with the upper and lower surfaces of the electronic parts assembly so as to form a sheet-like structure as a whole. The thickness of the outer case is thus made small (e.g., 1 mm or less). The sheet-like structure of the device of the present invention has high rigidity. Furthermore, since the display unit and keys do not project from the surfaces of the outer case, portability of the device is greatly improved, resulting in convenience. Although fastening pieces such as screws are not required to bring the upper and the lower covers into tight contact with the upper and the lower surfaces of the electronic parts assembly, the sheet-like compact electronic device has good waterproof and dustproof properties. Furthermore, after the cover members are adhered to the electronic parts assembly, unnecessary portions of the cover members can be cut in accordance with the size of the final product, thus obtaining a highly precise size of the final product and providing a good appearance.

BRIEF DESCRIPTION OF THE DRAWINGS

FIG. 4 is a plan view of an uppermost sheet 12 shown in FIG. 2;

FIG. 5 is a bottom view of the uppermost sheet 12 shown in FIG. 4;

FIGS. 20(a) and 20(b) are flow charts for explaining the assembly process of the sheet-like compact electronic device (FIG. 1) as a whole;

FIG. 25 is a plan view showing a lower sheet which has a shape different from that of the lower sheet shown in FIG. 8 and which is used for a sheet-like compact electronic calculator according to a second embodiment of the present invention;

FIG. 26 is an enlarged sectional view for explaining another manufacturing process using the lower sheet shown in FIG. 25;

FIG. 31 is a sectional view partially showing a sheet-like structure used for a sheet-like compact electronic calculator according to a sixth embodiment of the present invention;

FIG. 32 is a sectional view partially showing a sheet-like structure used for a sheet-like compact electronic calculator according to a seventh embodiment of the present invention;

FIG. 33 is a sectional view partially showing a sheet-like structure used for a sheet-like compact electronic calculator according to an eighth embodiment of the present invention; and FIG. 34 is a sectional view partially showing a sheet-like structure used for a sheet-like compact electronic calculator according to a ninth embodiment of the present invention.

DETAILED DESCRIPTION OF THE PREFERRED EMBODIMENTS

Figure 1:
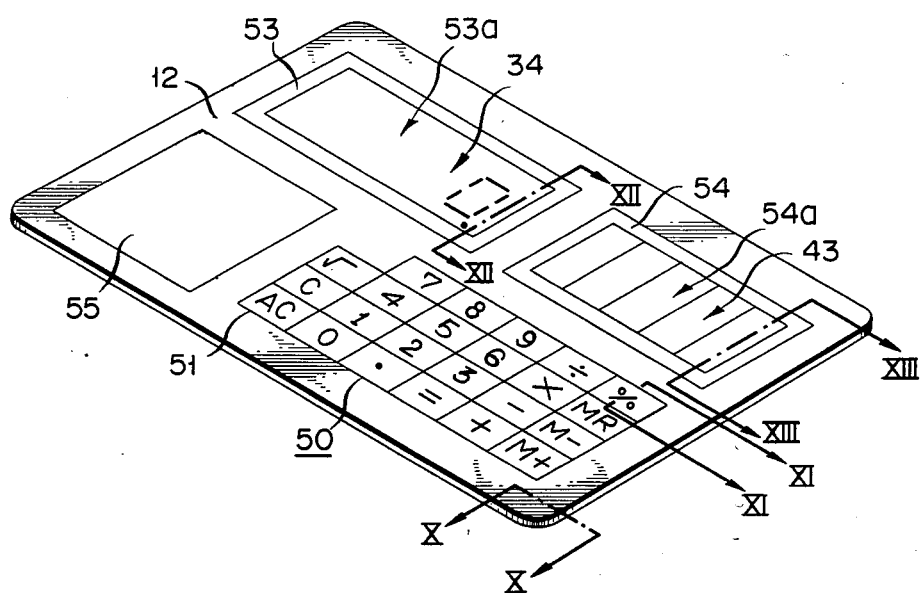
FIG. 1 is a perspective view showing an outer appearance of a compact electronic calculator according to a first embodiment of the present invention.
Figure 2A:
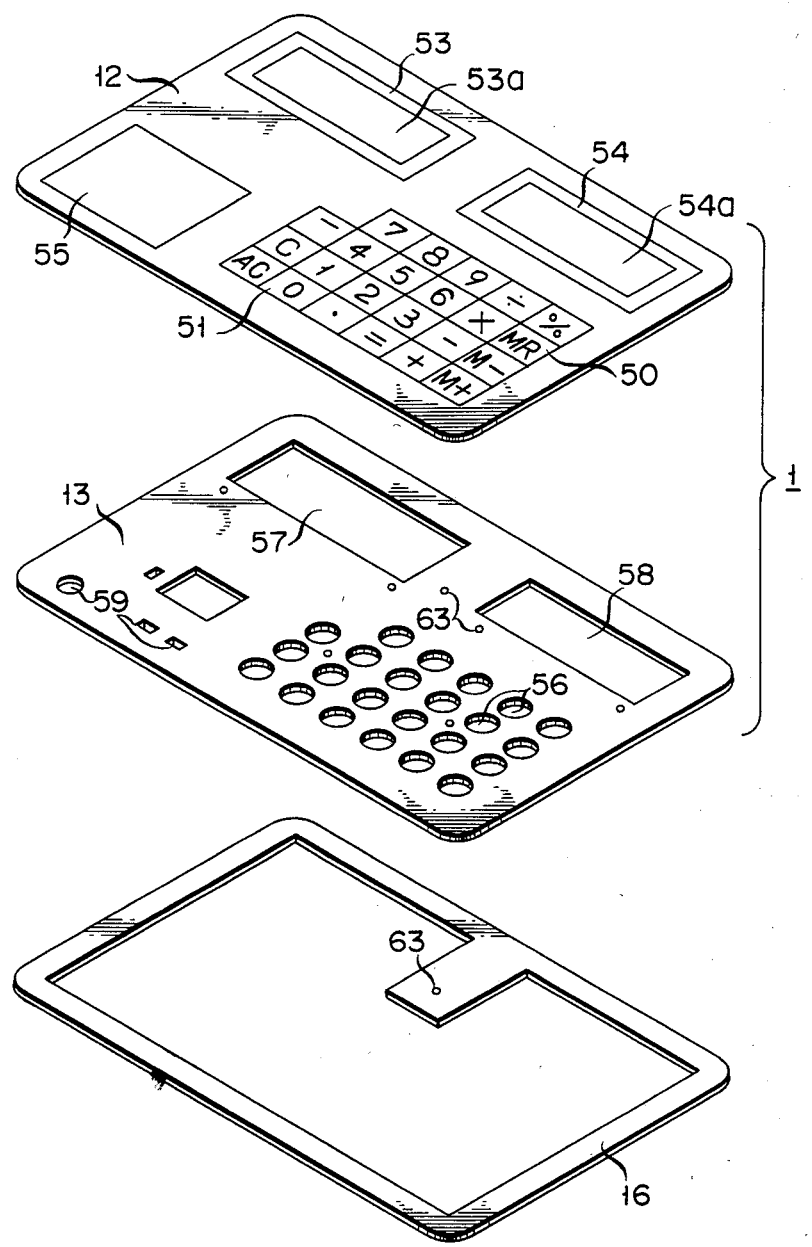
FIGS. 2(a) and 2(b) are exploded perspective views of the compact electronic calculator shown in FIG. 1.
Figure 2B:
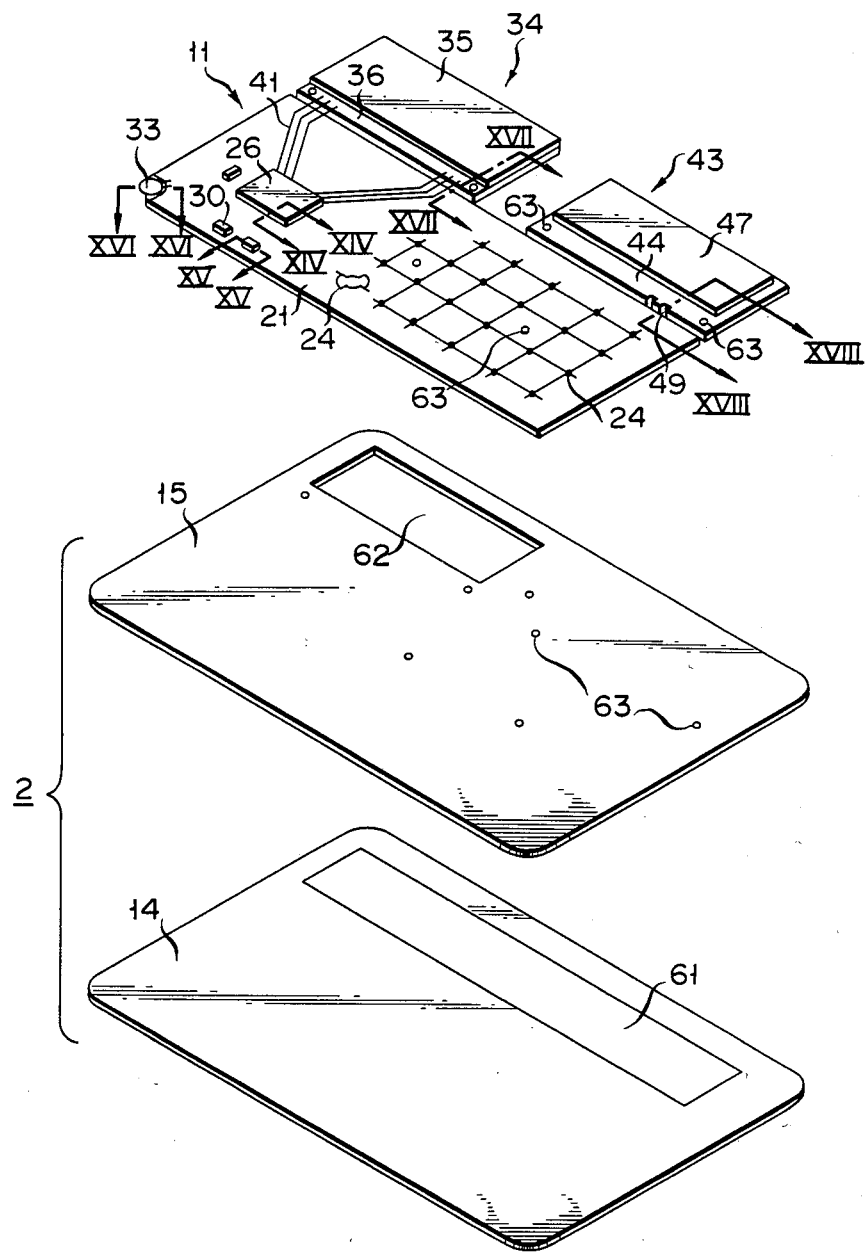

FIG. 1 is a perspective view showing the outer appearance of a compact electronic calculator according to an embodiment of the present invention. As is apparent from FIG. 1, the compact electronic calculator has a sheet-like rectangular shape. FIGS. 2(a) and 2(b) are exploded views of the sheet-like compact electronic calculator shown in FIG. 1. Referring to FIG. 1 and FIGS. 2(a) and 2(b), there are shown an electronic parts assembly 11; an uppermost sheet 12; an upper sheet 13; a lowermost sheet 14; a lower sheet 15; and a frame 16. The uppermost sheet 12, the upper sheet 13, the lowermost sheet 14, the lower sheet 15 and the frame 16 have the same dimensions and the same rectangular shape. The frame 16 covers and supports the electronic parts assembly 11. An upper cover 1 which comprises the uppermost sheet 12 and the upper sheet 13 is brought into tight contact with the upper surface of the electronic parts assembly 11, whereas a lower cover 2 which comprises the lowermost sheet 14 and the lower sheet 15 is brought into tight contact with the lower surface of the electronic parts assembly 11. In this manner, a sheet-like compact electronic calculator having a rectangular shape is manufactured.

Figure 3A:
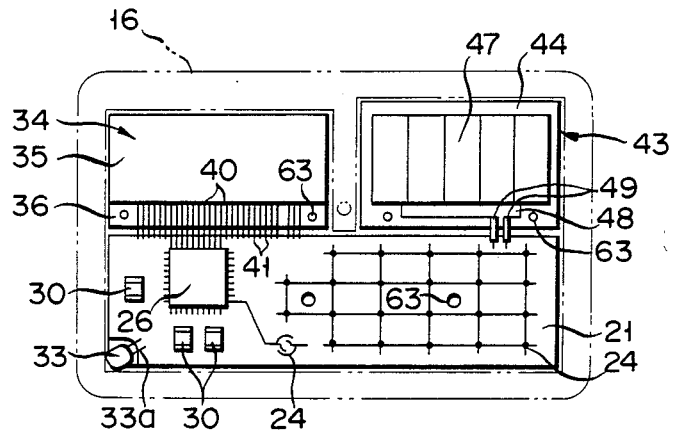
FIGS. 3(a) and 3(b) are a plan view of an electronic parts assembly and an exploded view of electronic parts, respectively.
Figure 3B:
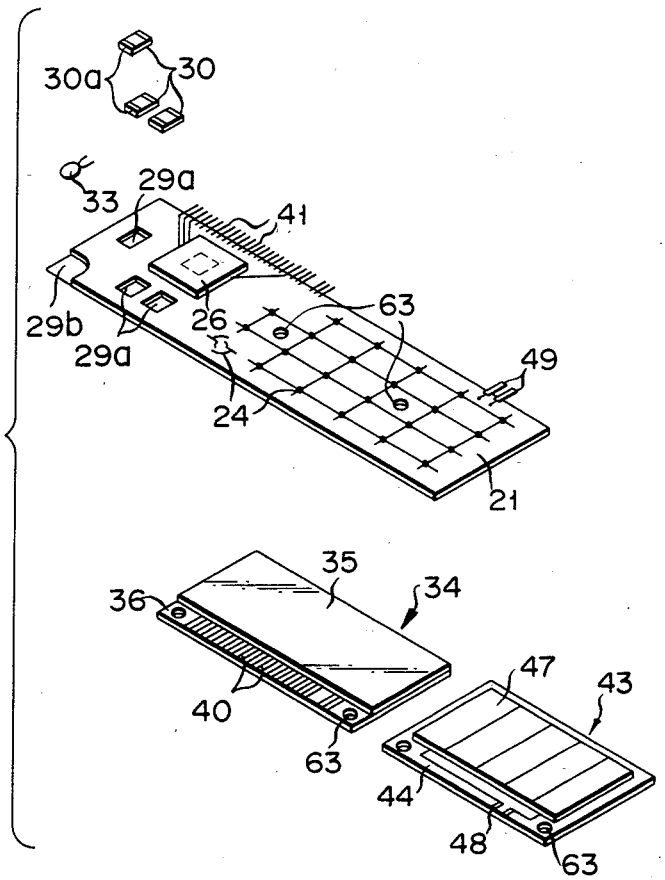
Figure 13:
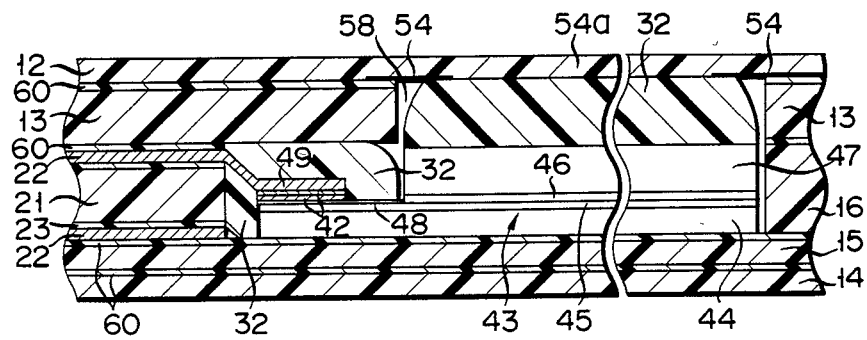
FIG. 13 is an enlarged sectional view of the compact electronic calculator taken along the line XIII—XIII in FIG. 1.
Figure 14:
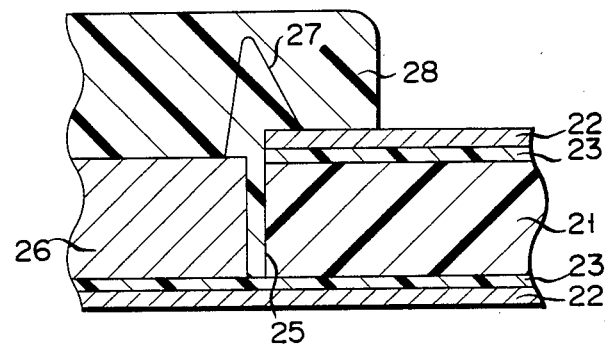
FIG. 14 is a sectional view of the compact electronic calculator taken along the line XIV—XIV in FIG. 2(b)
Figure 15A:
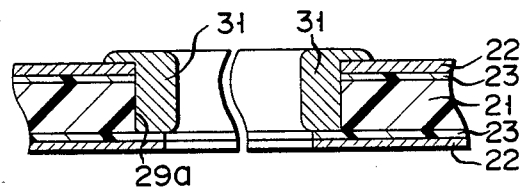
FIGS. 15(a) to 15(c) are enlarged sectional views for explaining the steps of manufacturing the compact electronic calculator, taken along the line XV—XV in FIG. 2(b)
Figure 15B:
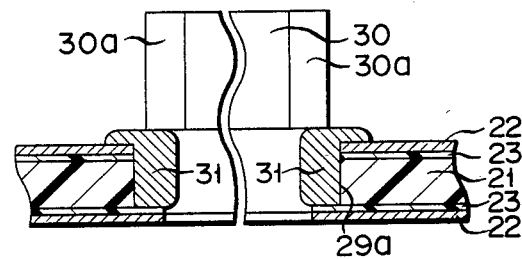
Figure 15C:
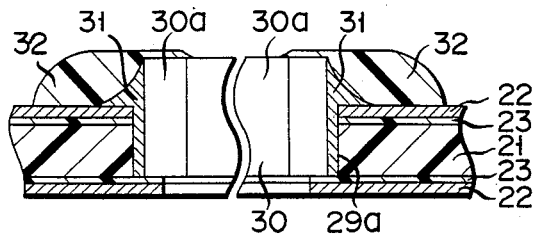
Figure 16A:
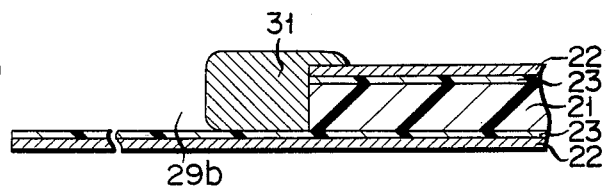
FIGS. 16(a) to 16(c) are enlarged sectional views for explaining the steps of manufacturing the compact electronic calculator, taken along the line XVI—XVI in FIG. 2(b)
Figure 16B:
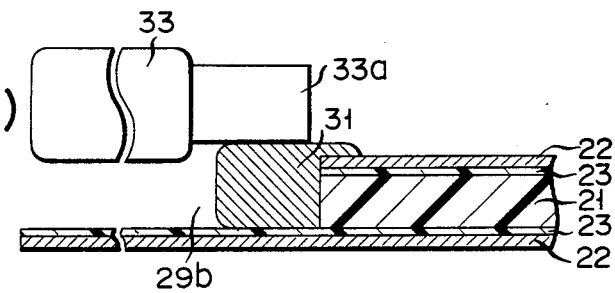
Figure 16C:
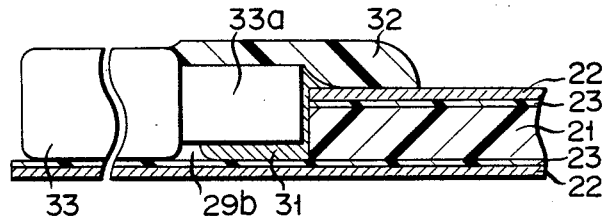
Figure 17A:
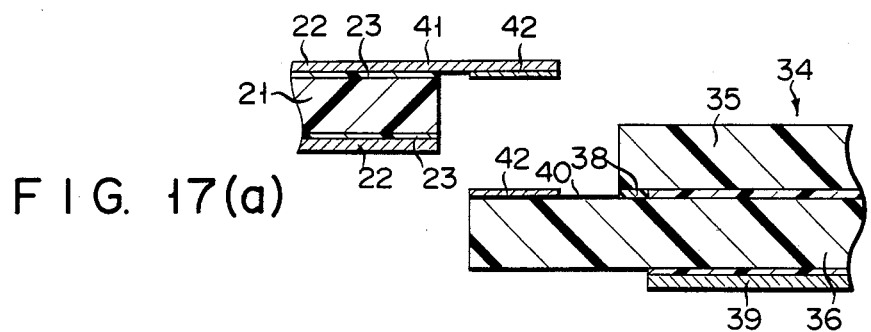
FIGS. 17(a) and 17(b) are enlarged sectional views for explaining the steps of manufacturing the compact electronic calculator, taken along the line XVII—XVII in FIG. 2(b)
Figure 17B:
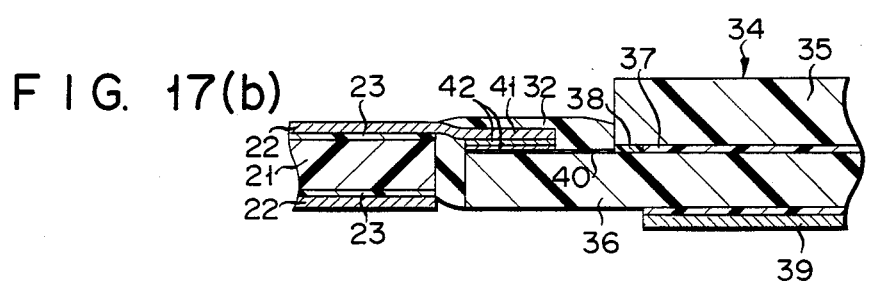
Figure 18A:
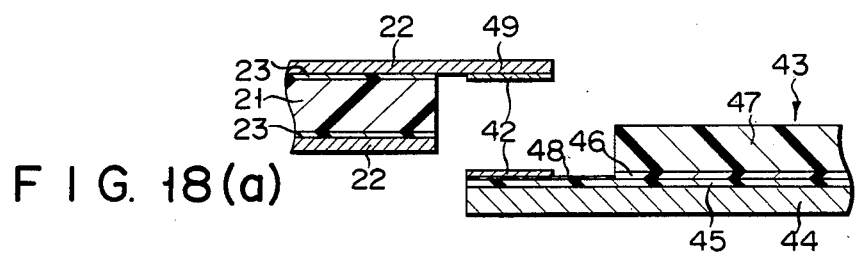
FIGS. 18(a) and 18(b) are enlarged sectional views for explaining the steps of manufacturing the compact electronic calculator, taken along the line XVIII—XVIII in FIG. 2(b)
Figure 18B:
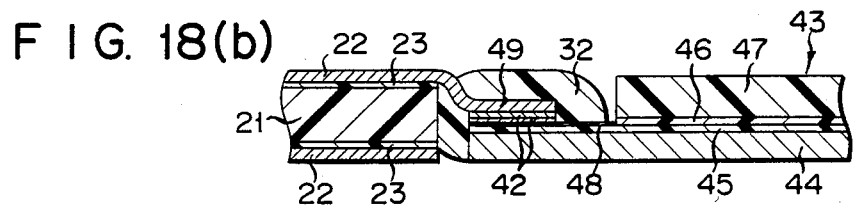

The components of the compact electronic calculator will be described with reference to FIGS. 3(a) and 3(b) to 18. The electronic parts assembly 11 is shown in FIGS. 3(a) and 3(b), FIGS. 14 and 15, FIGS. 16(a) to 16(c), FIGS. 17(a) and 17(b), and FIGS. 18(a) and 18(b). A board 21 is made of a rectangular sheet of a glass epoxy resin, a bismaleimide-triazine resin or the like and has a thickness of about 190μ. Copper films 22 of predetermined wiring patterns shown in FIG. 14 are respectively formed on the upper and lower surfaces of the board 21 through insulating adhesive layers 23. The copper film 22 has a thickness of about 35μ, and the insulating adhesive layer 23 has a thickness of about 20μ. The copper films 22 of wiring patterns on the upper and lower surfaces of the board 21 include wirings, contacts and terminals. The upper and lower patterns are connected to each other at a predetermined position of the board 21 through a through hole (not shown). The wiring pattern of the copper film 22 on the upper surface of the board 21 is schematically shown in FIG. 3(a) in which an integrated circuit element 26 as the central part of the circuit arrangement is connected to stationary contacts 24, capacitors 30, a display element 34, a dry cell 43 and a light-emitting diode 33. The plurality of stationary contacts 24 as the switching elements constitute part of the wiring pattern and form a matrix. Each stationary contact 24 has a pair of contacts, and each contact is connected to the integrated circuit element through another wiring pattern. A groove 25 is formed in the board 21 to leave the lower wiring pattern having the copper film 22 and the adhesive layer 23 on the lower surface of the board 21. A semiconductor integrated circuit element 26, that is, a large scale integrated circuit (LSI) is mounted in the groove 25, so that the semiconductor integrated circuit element 26 is disposed on the copper film 22 through the adhesive layer 23. The integrated circuit element 26 is connected to the copper film 22 of the upper wiring pattern of the board 21 through a metal wire 27. As shown in FIG. 14, the integrated circuit element 26 is also encapsulated by an insulating resin 28 such as silicone rubber or an epoxy resin from the top. The integrated circuit element 26 comprises a square chip having dimensions of 4 mm (length)×4 μmm (width)×200μ (thickness). The insulating resin 28 has a size of 10 mm (length)×10 mm (width) and a height of 245μ from the upper surface of the integrated circuit element 26. A groove 29a is formed such that the wiring pattern having the copper film 22 and the adhesive layer 23 on the lower surface of the board 21 is left. A chip capacitor 30 is disposed to be supported by the wiring pattern on the lower surface of the board 21. As shown in FIG. 15(c), the capacitor 30 is connected to the copper wire 22 of the wiring pattern on the upper surface of the board 21 through electrodes 30a connected at two ends of the groove 29a by cream solder portions 31. The capacitor 30 is also covered with an insulating adhesive 32 applied onto the upper surface of the board 21. The insulating adhesive may comprise an ultraviolet-curing ink. The capacitor 30 is connected to the integrated circuit element 26 through the wiring pattern consisting of the copper film 22 and the insulating adhesive layer 23. A notch 29b is formed such that the wiring pattern at the corner of the lower surface of the board 21 is left. As shown in FIG. 16(c), a voltage-controlling light-emitting diode 33 is disposed in the notch 29 and is supported by the copper film 22 through the insulating adhesive layer 23. Electrodes 33a of the light-emitting diode 33 are bonded to the cream solder portion 31 applied to the board 21 so that the light-emitting diode 33 is connected to the copper film 22 of the wiring pattern on the upper surface of the board 21. The light-emitting diode 33 is also encapsulated by the insulating adhesive 32 applied on the upper surface of the board 21. The insulating adhesive 32 may comprise an ultraviolet-curing ink. The light-emitting diode 33 is connected to the integrated circuit element 26 through the wiring pattern shown in FIG. 2(b). A display element or a liquid crystal panel 34 is disposed near the edge of the long side of the board 21. The display element 34 is connected to the wiring pattern on the upper surface of the board 21. The display element (liquid crystal panel) 34 has a structure in which upper and lower electrode bases 35 and 36 made of transparent resin films such as polyester films sandwich a liquid crystal 37 therebetween. The liquid crystal 37 is sealed by a seal 38. A reflector 39 having a thickness of about 50μ is adhered to the lower surface of the lower electrode base 35 through an adhesive layer having a thickness of about 15μ. A plurality of terminal electrodes 40 which comprise a transparent conductive ink and are connected to electrodes of the electrode bases 35 and 36 for displaying a character "8" (not shown) are aligned along the projected surface of the lower electrode base 36. The display element 34 has a thickness of about 550μ and is flexible because of the film bases. Terminals 41 which are extended portions of the copper film 22 of the wiring pattern are formed along the edge of the upper surface of the board 21. Also shown in FIG. 3(b), the terminals 41 extend from the long side of the board 21. The terminal electrodes 40 of the display element 21 are electrically connected to the terminals 41 of the board 21, respectively, since they are coated with a conductive adhesive 42 such as a carbon ink and are bonded with each other. The terminal electrodes 40 and the terminals 41 are then coated with the insulating adhesive 32 such as an ultraviolet-curing ink. The display element 34 is thus connected to the integrated circuit element 26 through the wiring pattern of the board 21. The display element 34 displays predetermined information in accordance with a signal from the integrated circuit element 26. A dry cell 43 such as a solar cell is disposed next to the display element 34 along the long side of the board 21. The dry cell 43 is connected to the wiring pattern of the board 21. As shown in FIGS. 18(a) and 18(b), the dry cell 43 has a structure in which an amorphous solar cell layer 46 is deposited on the upper surface of a metal substrate 44 of stainless steel through an insulating layer 45 such as polyimide having a thickness of about 25μ, a polyester film 47 is formed as a protective film on the solar cell layer 46 to a thickness of about 175μ, and a pair of terminal electrodes 48 are formed on the metal substrate 44 through the insulating film 45. The dry cell 43 has a thickness of about 300μ as a whole and is flexible. A pair of terminals 49 as extended portions of the copper film 22 of the wiring pattern are formed to oppose the dry cell 43 along the long side of the board 21, as shown in FIG. 3(b). The terminal electrodes 48 of the dry cell 43 are electrically connected to the terminals 49 of the board 21, respectively, since their contact portions are coated with the conductive adhesive 42 (e.g., carbon ink). The terminal electrodes 48 and the terminals 49 are then coated with the insulating adhesive 32 such as an ultraviolet-curing ink. Therefore, the dry cell 43 is connected to the integrated circuit element 26 through the wiring pattern of the board 21.

Figure 9:
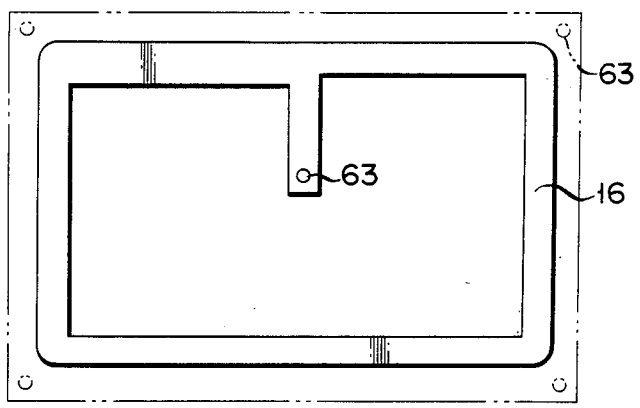
FIG. 9 is a plan view of a frame 16 shown in FIG. 2.
Figure 10:
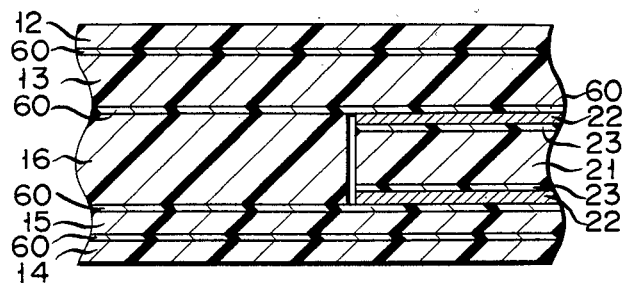
FIG. 10 is an enlarged sectional view of the compact electronic calculator taken along the line X—X in FIG. 1.

The electronic parts assembly 11 having the configuration described above is arranged in the frame 16. The frame 16 is made of rigid polyvinyl chloride and has a thickness of about 300μ. As shown in FIG. 9, the frame 16 has a rectangular shape and is so constructed as to mount the electronic parts assembly 11 therein in accordance with its arrangement. The frame 16 holds the board 21, the display element 34 and the dry cell 43 so as not to move them in the longitudinal direction, as shown in FIG. 13.

Figure 6:
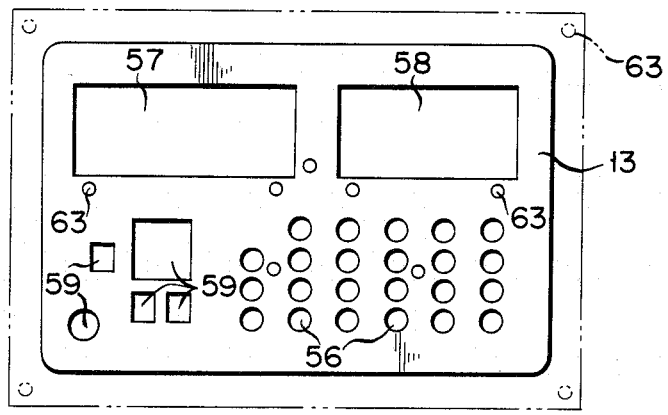
FIG. 6 is a plan view of an upper sheet 13 shown in FIG. 2.

The uppermost sheet 12 and the upper sheet 13 are described with reference to FIGS. 4 to 6 and FIGS. 10 to 13. The uppermost sheet 12 is a rectangular sheet made of a transparent resin such as a polyester film having a thickness of about 80μ. As shown in FIGS. 4 and 5, an operation section 50 is disposed corresponding to the stationary contacts of the the board 21 for mounting the electronic parts assembly 11. In the operation section 50, key name print portions 51 for a plurality of keys respectively corresponding to the stationary contacts 24 of the board 21 are formed on the lower surface of the uppermost sheet 12. A plurality of movable contacts 52 respectively corresponding to the stationary contacts 24 are aligned by printing a carbon ink under the key name print portions 51, respectively. The movable contact 52 has a thickness of 15 to 30μ. A frame-like display window print portion 53 which constitutes a display window 53a is printed on the lower surface of the uppermost sheet 12 and opposes the display element 34 of the electronic parts assembly 11. A dry cell window print portion 54 which constitutes a dry cell window 54a is formed to oppose the dry cell 43. It is noted that a nontransparent print portion is shown at 55. The upper sheet 13 is a rectangular sheet made of a synthetic resin such as a rigid polyvinyl chloride. The upper sheet 13 has a thickness of about 180μ and is flexible. In the upper sheet 13, as shown in FIG. 6, a plurality of through holes 56 are formed corresponding to the stationary contacts 24 (FIG. 2) of the board 21, respectively. Through holes 57 and 58 are formed in the upper sheet 13 and correspond to the mounting positions of the display element 34 and the dry cell 43, respectively. It is noted that holes are indicated at 59 for inserting the integrated circuit element 26 of the board 21, the capacitor 30 and the light-emitting diode 33 so as to allow projection of these elements from the surface.

Figure 7:
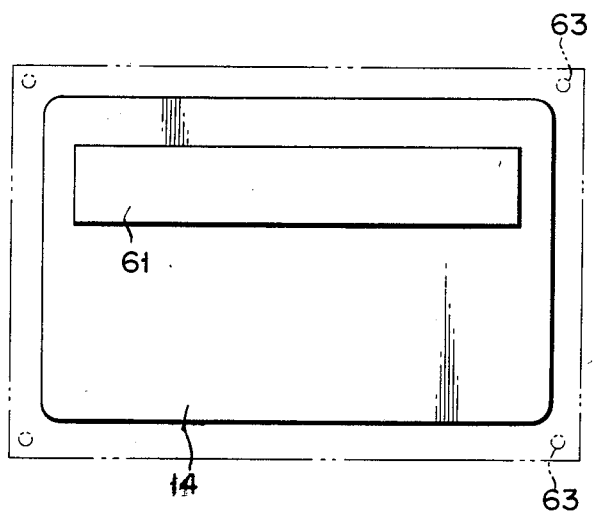
FIG. 7 is a plan view of a lowermost sheet 14 shown in FIG. 2.
Figure 8:
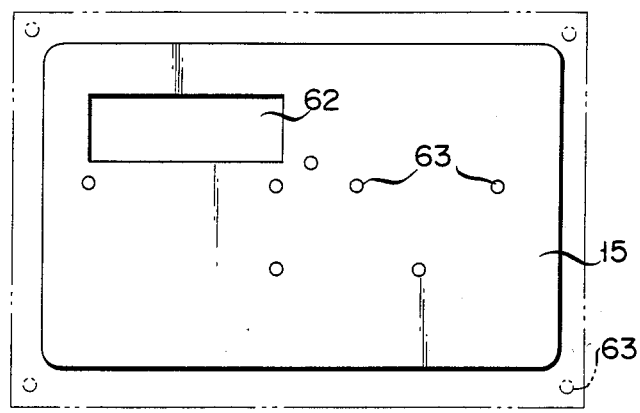
FIG. 8 is a plan view of a lower sheet 15 shown in FIG. 2.

The lowermost sheet 14 and the lower sheet 15 will be described with reference to FIGS. 7 and 8 and FIGS. 10 to 13. The lowermost sheet 14 is made of a synthetic resin film such as a polyester film having a thickness of about $80\mu$. The lowermost sheet 14 has a sheet-like rectangular shape and is flexible. As shown in FIG. 7, a nontransparent print portion 61 is formed on the upper surface of the lowermost sheet 14, as shown in FIG. 7. The lower sheet 15 is also made of a synthetic resin film such as a polyester film having a thickness of about $80\mu$. The lower sheet 15 has a sheet-like rectangular shape and is flexible. As shown in FIG. 8, a hole 62 is formed in the lower sheet 15 so as to allow insertion of the display element 34 of the electronic parts assembly 11 therein.

The upper sheet 13 is adhered to the upper surface of the frame 16 and the board 21 of the electronic parts assembly 11 through an insulating adhesive layer 60 having a thickness of $20\mu$. The lower sheet 15 is adhered to the lower surface of the frame 16 and the board 21 of the electronic parts assembly 11 through another insulating adhesive layer 60 having a thickness of $20\mu$. The upper sheet 13 covers the upper surfaces of the board 21 of the electronic parts assembly 11, the integrated circuit element 26, the capacitor 30, the display element 34, and the dry cell 43. The lower sheet 15 covers and supports the lower surfaces of the board 21, the display element 34 and the dry cell 43. The frame 16 surrounds the electronic parts assembly 11 and is sandwiched between the upper sheet 13 and the lower sheet 15. The uppermost sheet 12 is adhered to the upper surface of the upper sheet 13 through still another adhesive layer 60 having a thickness of about $20\mu$. The lowermost sheet 14 is adhered to the lower surface of the lower sheet 15 through still another adhesive layer 60 having a thickness of about $20\mu$.

Figure 11:
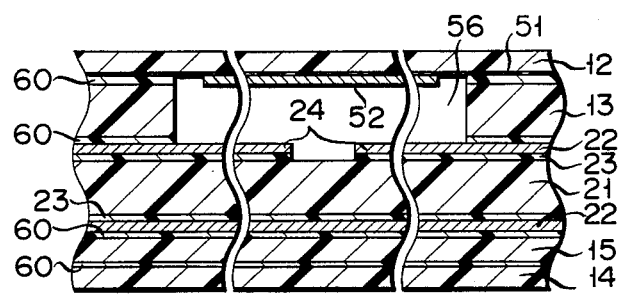
FIG. 11 is an enlarged sectional view of the compact electronic calculator taken along the line XI—XI in FIG. 1.
Figure 12:
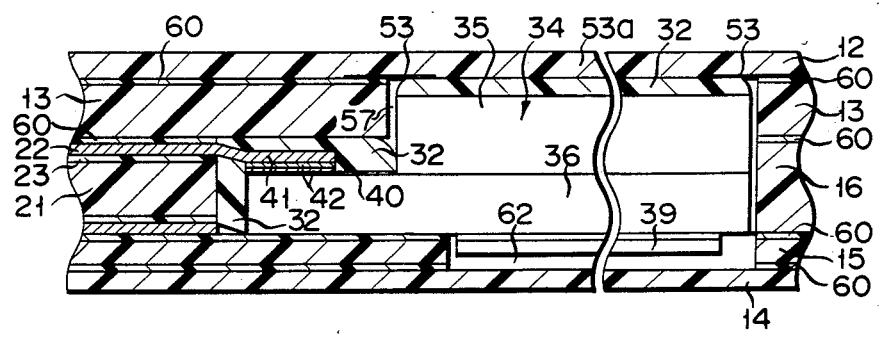
FIG. 12 is an enlarged sectional view of the compact electronic calculator taken along the line XII—XII in FIG. 1.

A laminate structure will be described in detail which has the electronic parts assembly 11 sandwiched between a set of uppermost and upper sheets 12 and 13 and a set of lowermost and lower sheets 14 and 15. Since the uppermost sheet 12 covers the upper surface of the upper sheet 13, the key name print portions 51 of the uppermost sheet 12 cover the holes 56 of the upper sheet, respectively. The movable contacts 52 are located in the holes 56, respectively. The display window print portion 53 of the uppermost sheet 12 and the dry cell window print portion 54 are aligned with edges of the holes 57 and 58 of the upper sheet 13, respectively. Transparent sheet portions surrounded by the frames of the print portions 53 and 54, that is, the display window 53a and the dry cell window 54a cover the holes 57 and 58, respectively. The lowermost sheet 14 covers the lower surface of the lower sheet 15, so that the nontransparent print portion 61 covers the bottom of the hole 62 (FIG. 2) of the lower sheet 15. Furthermore, as shown in FIG. 11, the holes 56 of the upper sheet 13 are located to surround the stationary contacts 24 of the board 21, respectively. The movable contacts 52 of the uppermost sheet 12 are positioned above the stationary contacts 24 through holes 56, respectively. The operation switches are constituted by the key name print portions 51 of the uppermost sheet 12, the movable contacts 52, the holes 56 of the upper sheet 13, and the stationary contacts 24 of the board 21. When the user presses one of the key name print portions 51 of the uppermost sheet 12, the corresponding one of the movable contact 52 is brought into contact with the corresponding one of the stationary contact 24 of the board 21 through the corresponding one of the holes 56. In this manner, the switch is turned on. As shown in FIG. 12, the display element 34 opposes part of the uppermost sheet 12 surrounded by the display window print portion 53, that is, the display window 53a through the hole 57 of the upper sheet 13 of the upper cover 1. The user can visually observe the contents displayed by the display element 34 through the display window 53a from the outside of the upper cover 1. As shown in FIG. 13, the dry cell 43 opposes part of the upper sheet 13 which is surrounded by the dry cell window print portion 53. The part of the upper sheet 13 corresponds to the dry cell window 54a, so that sunlight is received from the outside of the upper cover 1 to the inside through the dry cell window 54a. The insulating adhesive layers 32 of an ultraviolet-curing ink or the like are formed between the uppermost sheet 12 and the upper surfaces of the display element 34 and the dry cell 43.

The electronic parts assembly 11 is surrounded and supported by the frame 16. The upper and lower surfaces of the frame 16 having the electronic parts assembly 11 therein are respectively covered with the upper and lower sheets 13 and 15. Furthermore, the upper and lower surfaces of the upper and lower sheets 13 and 15 are respectively covered with the uppermost and lowermost sheets 12 and 14. As a result, a sheet-like compact electronic calculator is manufactured.

In this calculator, the uppermost sheet 12 has a thickness of $80\mu$; the adhesive layer 60 between the uppermost sheet 12 and the upper sheet 13, $20\mu$; the upper sheet 13, $180\mu$; the adhesive layer 60 between the upper sheet 13 and the board 21, $20\mu$; the board 21, $300\mu$; the adhesive layer 60 between the board 21 and the lower sheet 15, $80\mu$; the lower sheet 15, $80\mu$; the adhesive layer 60 between the lower sheet 15 and the frame 16, $80\mu$; and the lowermost sheet 14, $80\mu$. As a result, the sheet-like compact electronic calculator according to the present invention has a total thickness of $800\mu$ (0.8 mm). The sheets 12, 13, 14 and 15, the frame 16 and the board 21 have sufficient mechanical strength when they are deflected with a radius of curvature of about 40 mm. The compact calculator as a whole must be flexible to provide sufficient mechanical strength. The display element 34 of the electronic parts assembly 11 and the dry cell 43 also present sufficient mechanical strength when they are deflected with a radius of curvature of about 40 mm.

Since the frame 16 is sandwiched between the upper and lower sheet 13 and 15, it firmly supports and surrounds the electronic parts assembly 11. In this manner, the electronic parts assembly 11 is formed integrally with the upper and lower sheets 13 and 15, thus increasing the strength of the sheet-like structure. Furthermore, the distance between the upper sheet 13 and the lower sheet 15 corresponds to the width of the frame 16, and the width corresponds to the thickness of the electronic parts assembly 11, thereby properly sealing the edges of the sheet-like structure.

The sheet-like compact electronic calculator has a structure in which the board 21 is sandwiched by the upper and lower sheets 13 and 15 (in this embodiment, the upper and lower sheets 13 and 15 are made of a synthetic resin having mechanical strength higher than that of the board 21). When a bending force is applied to the calculator, the stress is deconcentrated into the board 21 and the upper and lower sheets 13 and 15. Since the upper and lower sheets 13 and 15 have high strength, they absorb the bending force, so that the board 21 is protected and a highly strong sheet structure is provided. Furthermore, in order to provide a good outer appearance of the calculator, the uppermost and lowermost sheets 12 and 14 serve not to damage or scratch the upper and lower sheets 13 and 15 and also provide more strength against the bending stress. The operation section 50 is arranged on the uppermost sheet 12 to be pressed for operation by utilizing the elasticity thereof. As a result, the user can press the key in the operation section 50 to bring the movable contact 24 into contact with the stationary contact 22 of the board 21 through the hole 56 of the upper sheet 13. The flat operation section 50 can be formed by a combination of the uppermost sheet 12 and the upper sheet 13, and the operation section 50 does not project from the upper surface of the uppermost sheet 12, thus providing a flat sheet-like case.

A method for manufacturing the sheet-like compact electronic calculator according to the first embodiment of the present invention will be described with reference to FIGS. 19(a) and 19(b) to 24. In the fundamental manufacturing process, the electronic parts assembly 11 is assembled, and at the same time the sheets 12 to 15 and the frame 16 are formed. The upper and lower sheets 13 and 15 are then adhered to the upper and lower surfaces of the electronic parts assembly 11, and then the uppermost and lowermost sheets 12 and 14 are adhered to the exposed surfaces of the upper and lower sheets 13 and 15, respectively. The peripheral portion of the resultant sheet-like structure is cut to obtain a sheet-like structure having a predetermined shape.

Figure 19A:
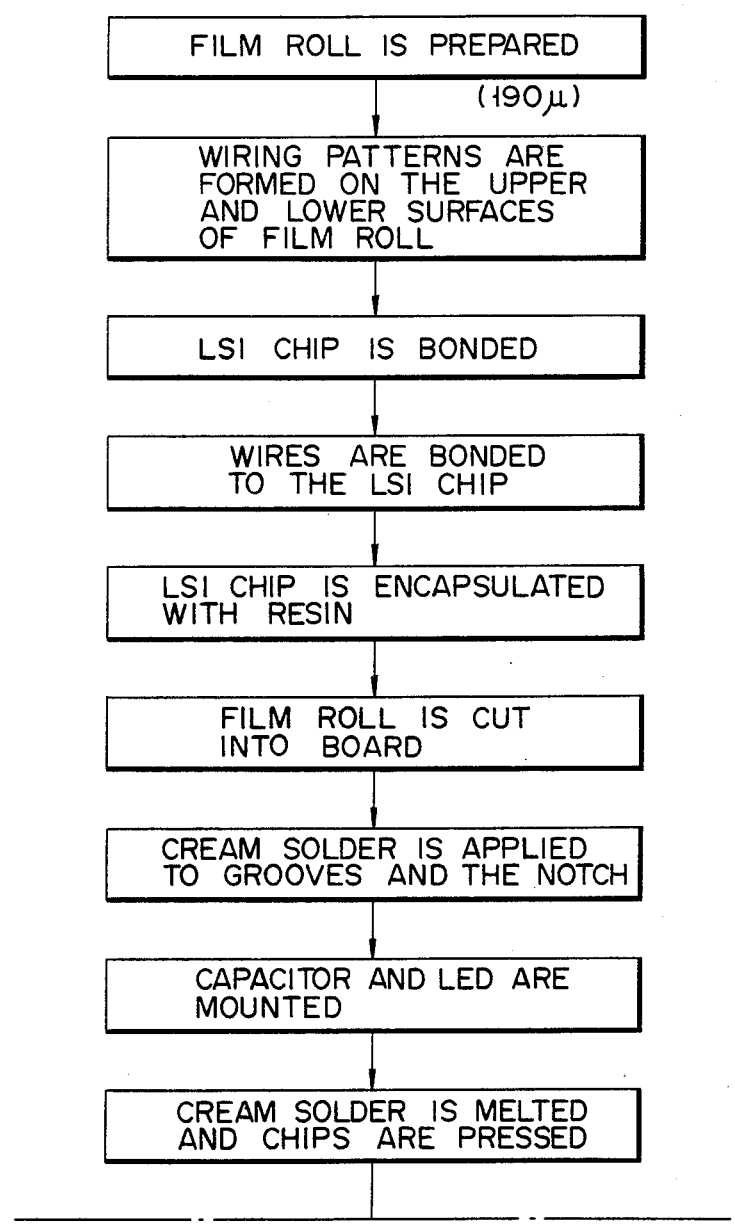
FIGS. 19(a) and 19(b) are flow charts for explaining the assembly process of the electronic parts assembly of the sheet-like compact electronic calculator shown in FIG. 1.
Figure 19B:
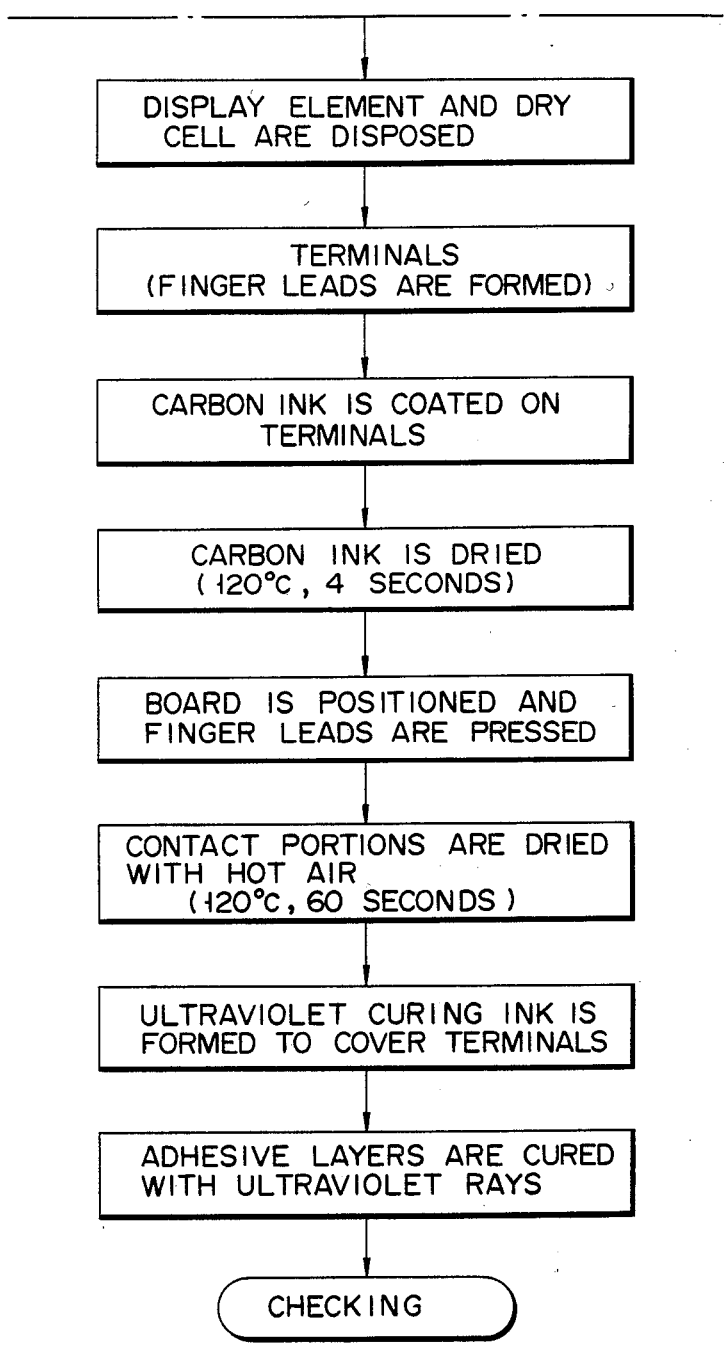
Figure 21:
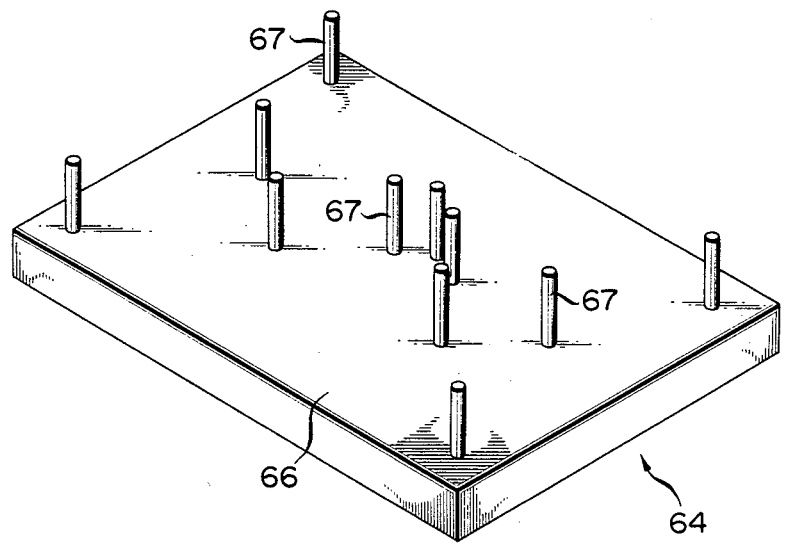
FIGS. 21 and 22 are perspective views showing aligning jigs used for the assembly of the units of the compact electronic device, respectively.

The manufacturing process of the electronic parts assembly 11 is described with reference to FIGS. 19(a) and 19(b). A film roll of a glass epoxy resin which has a plurality of boards 21 with the grooves 25 (FIG. 14) and the grooves 29a (FIGS. 15(a) and 15(b)) is prepared. The film roll is sequentially fed to form predetermined wiring patterns of the copper films 22 on the upper and lower surfaces of each portion of the film roll corresponding to the board 21. The integrated circuit element (LSI) 26 is bonded in the hole 25 of the board 21. After the wires are bonded to the integrated circuit element 26 and the integrated circuit element 26 is encapsulated with the resin 28, the film roll is cut into boards 21. The cream solder portions 31 are applied to the grooves 29a and the notch 29b (FIG. 3(b)), as shown in FIG. 16(a). As shown in FIGS. 15(b) and 15(c) and FIGS. 16(b) and 16(c), the capacitors 30 and the light-emitting diode 33 are respectively inserted in the grooves 29a and the notch 29b. The cream solder portions 31 are melted, and the capacitors 30 and the light-emitting diode 33 are pressed and fixed. The display element 34 and the dry cell 43 are disposed in the vicinity of the board 21, the terminals (finger leads) 41 and 49 are formed and the conductive adhesive layers 42 are formed thereon. The adhesive layers 42 (e.g., carbon ink) are then half-dried by hot air at a temperature of 120° C. for 4 seconds. Thereafter, the board 21 is positioned, and the terminals 41 and 49 are adhered by pressure to the terminal electrodes of the display element 34 and the dry cell 43. The contact portions are then completely dried by hot air at a temperature of 120° C. for 60 seconds. Finally, the insulating adhesive layers 32 such as an ultraviolet-curing ink are formed to cover the terminal connections of the capacitors 30, the light-emitting diode 33, the display element 34 and the dry cell 43. The adhesive layers 32 are then cured by ultraviolet rays. Holes 63 for aligning jigs are formed in parts of the board 21, the display element 34 and the dry cell 43, respectively (FIG. 3(b)).

The manufacturing process of the uppermost and lowermost sheets 12 and 14 will be described. A film roll having a thickness of 80μ is prepared to form the uppermost and lowermost sheets 12 and 14. The film roll is fed, and the key name print portions 51, the display window print portion 53 and the dry cell window print portion 54 are printed thereon. Thereafter, the carbon ink is applied thereto. The film roll is cut into pieces each corresponding to the uppermost sheet 12. Similarly, the film roll is fed, and the nontransparent print portion 61 is sequentially printed thereon. The film roll is cut into pieces each corresponding to the lowermost sheet 14. The resultant uppermost sheet 12 has a size greater than the final size thereof, as indicated by the alternate long and two dashed line in FIGS. 4 and 5. Similarly, the resultant lowermost sheet 14 has a size greater than the final size thereof, as indicated by the alternate long and two dashed line in FIG. 7. The resultant uppermost and lowermost sheets 12 and 14 are punched to form the holes 63 for aligning jigs. The positions of the holes 63 correspond to the outline of the final uppermost and lowermost sheets 12 and 14. In other words, the sheets 12 and 14 are formed to have a size greater than that of the final product so as to perform alignment in the manufacturing process.

The manufacturing process for the upper and lower sheets 13 and 15 and the frame 16 will be described below. Film rolls of a synthetic resin such as rigid PVC having the same thickness as that of the sheets 13 and 15 and the frame 16, are prepared in the manufacturing processes of the upper and lower sheets 13 and 15 and the frame 16, respectively. The roll films are respectively fed and cut into predetermined sizes to prepare the upper and lower sheets 13 and 15, and the frame 16. The resultant upper sheet 13 has a size greater than that of the final product, as indicated by the alternate long and two dashed line in FIG. 6. At the same time, the upper sheet 13 is punched to form the holes 56 to 59. Similarly, the resultant lower sheet 15 has a size greater than that of the final product, as indicated by the alternate long and two dashed line in FIG. 8. At the same time, the lower sheet 15 is punched to form the hole 62. The resultant frame 16 has a size larger than that of the final product, as indicated by the alternate long and two dashed line in FIG. 9. At the same time, the frame 16 is punched to have the shape shown in FIG. 9. The holes 63 are formed to align the upper and lower sheets and the frame, respectively shown in FIGS. 6, 8 and 9.

Figure 22:
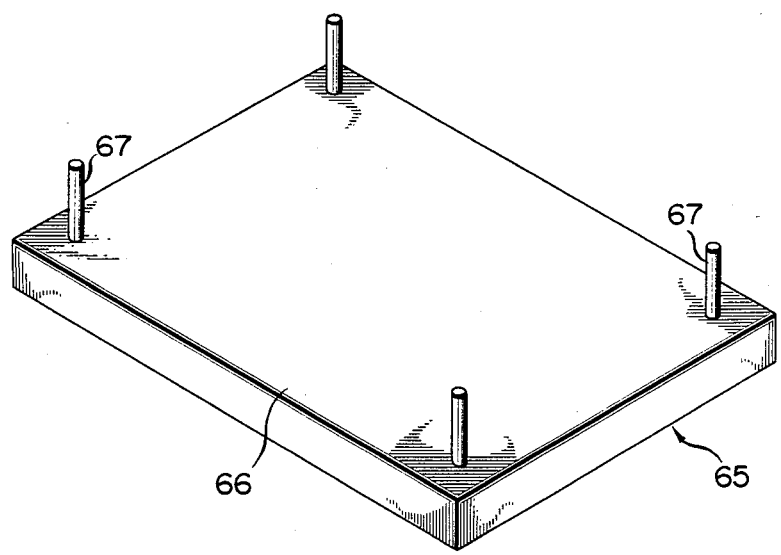

The resultant members are assembled in accordance with the flow chart in FIGS. 20(a) and 20(b). A jig 64 shown in FIG. 21 and a jig 66 shown in FIG. 22 are used to assemble the resultant members. Pins 67 extend from a base 66 of the jig 64 at predetermined positions corresponding to the outside and inside of the final product so as to align the members with each other with respect thereto. Similar pins 67 extend from a base 66 of the jig 65 at predetermined positions corresponding to the outside of the final product. The bases 66 of the jigs 64 and 65 have sizes greater than that of the final product. The positions of the pins 67 respectively correspond to the holes 63.

Figure 23:
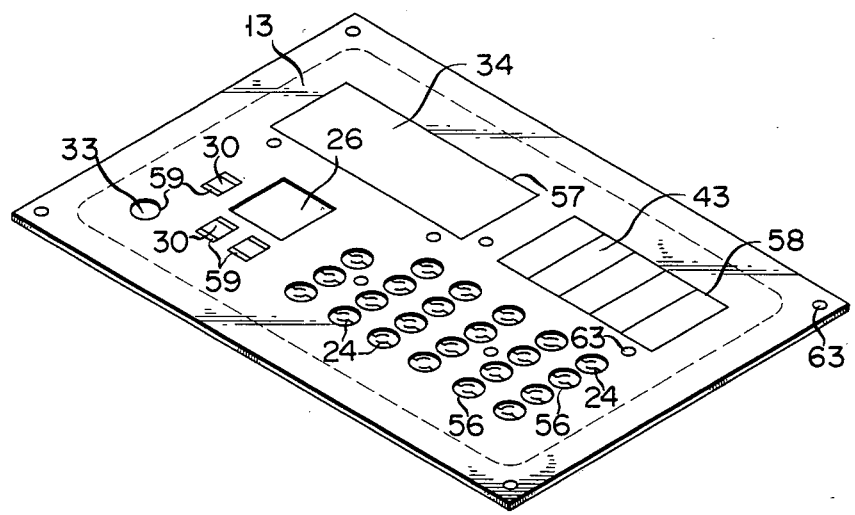
FIGS. 23 and 24 are perspective views showing different states of the compact electronic calculator shown in FIG. 1 during the manufacturing process.

The insulating adhesive layer 60 is formed on the upper surface of the lower sheet 15 which is then held by the jig 64. In this case, the pins 67 of the jig 64 are fitted in the holes 63 of the lower sheet 15, respectively. The lower sheet 15 is thus placed on the upper surface of the base 66. Subsequently, the pins 67 of the jig 64 are fitted in the holes 63 of the board 21, the display element 34 and the dry cell 43 so as to hold the electronic parts assembly 11 on the base 66 in alignment with the lower sheet 15. In other words, the electronic parts assembly 11 covers the lower sheet 15 through the adhesive layer. In this condition, the electronic parts assembly 11 is adhered by pressure and heat to the lower sheet 15. The frame 16 is then positioned by fitting the pins 67 of the jig 64 in the holes 63 in the same manner as described above. The frame 16 is placed on a peripheral portion of the lower sheet 15 and is adhered by pressure and heat to the lower sheet 15. In this condition, the frame 16 surrounds the electronic parts assembly 11. The insulating adhesive layer 60 is formed on the lower surface of the upper sheet 13. The upper sheet 13 is then aligned with the electronic parts assembly 11 and the frame 16, using the jig 64, and is adhered by heat and pressure thereto. As a result, a laminate or sheet-like structure which comprises the electronic parts assembly 11, the upper and lower sheets 13 and 15, and the frame 16 is prepared as shown in FIG. 23.

Figure 24:
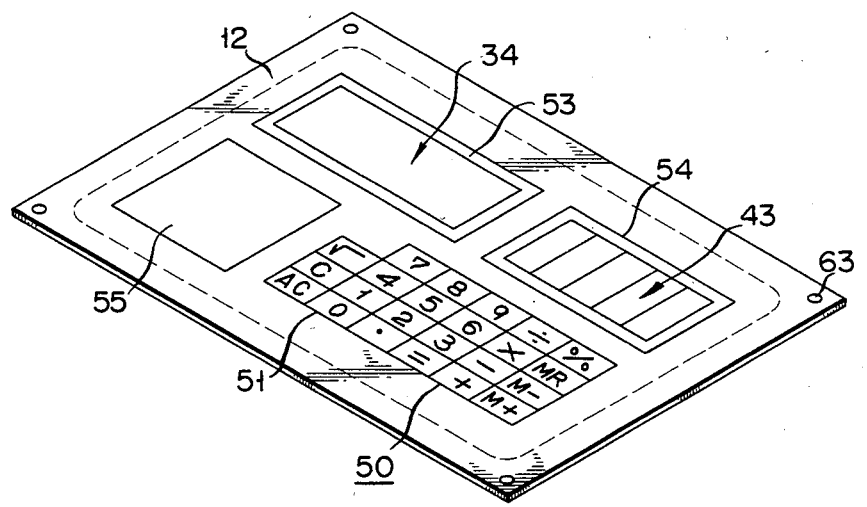

The insulating adhesive layer 60 is formed on the upper surface of the sheet-like structure, that is, the upper surface of the upper sheet 13. The adhesive layer 32 (FIG. 13) of an ultraviolet-curing ink is formed on the upper surfaces of the display element 34 (FIG. 12) and the dry cell 43. In this condition, the jig 65 is used instead of the jig 64. When the pins 67 of the jig 65 are fitted in the holes 63, the sheet-like structure is placed on the base 66 of the jig 65. The uppermost sheet 12 covers the upper sheet 13 as a part of the laminate and is adhered by heat and pressure thereto. Thereafter, the ultraviolet-curing ink on the upper surfaces of the display element 34 and the dry cell 43 is cured by radiating ultraviolet rays thereon. The resultant laminate is turned upside down and is then positioned using the jig 65. The adhesive layer 60 is then formed on the exposed surface of the lower sheet 15. The lowermost sheet 14 is held by the jig 65 and overlies the lower sheet 14 and is adhered by heat and pressure thereto. As a result, a laminate or sheet-like structure is prepared in which the uppermost and lowermost sheets 12 and 14 are respectively adhered to the upper and lower sheets 13 and 15, as shown in FIG. 24. In other words, the electronic parts assembly 11, the uppermost sheet 12, the upper sheet 13, the lowermost sheet 14 and the lower sheet 15 are integral with each other so as to constitute a single laminate.

The peripheral portion of the resultant laminate is then cut to have the same size as that of the final product shown in FIG. 1. In other words, since the uppermost sheet 12, the upper sheet 13, the lowermost sheet 14, the lower sheet 15 and the frame 16 have a size greater than that of the final product, the unnecessary peripheral portion is cut so that the laminate has the same size as that of the final product. As a result, the peripheral portion of the frame 16 is left so as to constitute the sides of the sheet-like structure.

The electronic parts assembly 11 is supported by the frame 16, as shown in FIG. 1. At the same time, the electronic parts assembly 11 is sandwiched between the upper and lower sheets 13 and 15. Furthermore, the uppermost and lowermost sheets 12 and 14 are adhered to the upper and lower sheets 13 and 15, respectively. A sheet-like compact electronic calculator is thus prepared.

A sheet-like compact electronic calculator according to a second embodiment of the present invention will be described with reference to FIGS. 25 and 26, in which a method for manufacturing the calculator of the second embodiment differs from that of the first embodiment. In the second embodiment, as shown in FIG. 25, bosses 69 of rigid PVC are formed by printing on predetermined positions of the upper surface of a lower sheet 151 so as to have the same height corresponding to a total thickness of the upper sheet 13 and the electronic parts assembly 11. The electronic parts assembly 11, the frame 16 and the upper sheet 13 are aligned with respect to the bosses 69 and are adhered to each other. As shown in FIG. 26, the uppermost sheet 12 is adhered to the lower sheet 14 through the adhesive layer 60 using the jig 65 (FIG. 22). The unnecessary peripheral portion is then cut to have the same size as that of the final product. According to this method, since the bosses 69 are formed on the lower sheet 151, the jig 64 shown in FIG. 21 need not be used, resulting in simple manufacturing process and low cost. If the same bosses as the bosses 69 shown in FIG. 25 are formed on upper surface of the lower sheet 14, the jig 65 need not be used.

Figure 27:
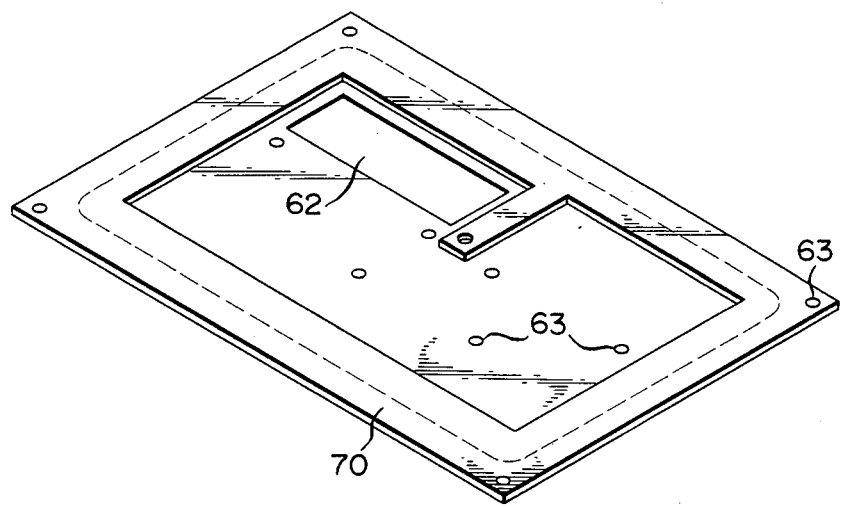
FIG. 27 is a perspective view showing that the lower sheet (FIG. 8) is integrally formed with the frame (FIG. 9) so as to form a laminate used for a sheet-like compact electronic calculator according to a third embodiment of the present invention.
Figure 28:
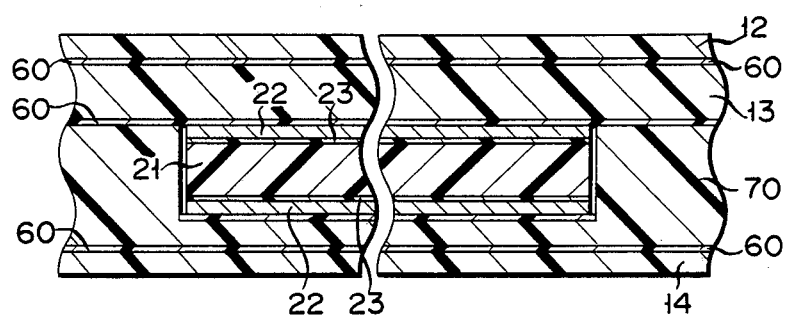
FIG. 28 is an enlarged sectional view partially showing a sheet-like structure which uses the laminate shown in FIG. 27 and which constitutes the sheet-like compact electronic calculator according to the third embodiment of the present invention.

A sheet-like electronic calculator according to a third embodiment of the present invention will be described with reference to FIGS. 27 and 28, in which the sheet-like structure of the third embodiment differs from that of the first embodiment. In the third embodiment, as shown in FIG. 27, a sheet 70 is used in place of a combination of the lower sheet 15 and the frame 16. The sheet 70 is formed to have a shape corresponding to an integral body of the lower sheet 15 and the frame 16, as shown in FIG. 27. FIG. 28 is a sectional view of a sheet-like compact electronic calculator in which the sheet-like structure is prepared using the sheet 70 in the same process used in the first embodiment, and an unnecessary peripheral portion thereof is cut to have the same size as that of the final product. According to the calculator having the structure described above, the number of members is decreased. Furthermore, the alignment of the frame for holding the electronic parts assembly 11 can be omitted.

Figure 29:
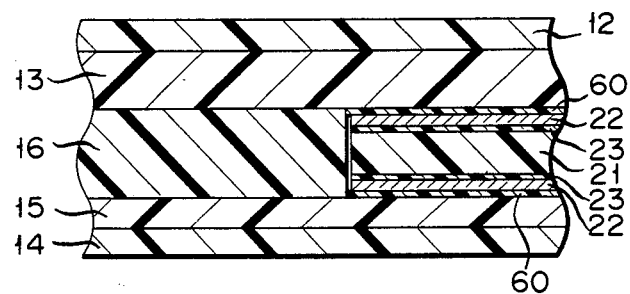
FIG. 29 is a sectional view partially showing a sheet-like structure which constitutes a sheet-like compact electronic calculator according to a fourth embodiment of the present invention and which is made by hot-pressing sheets.

A sheet-like compact electronic calculator according to a fourth embodiment of the present invention will be described with reference to FIG. 29. The sheets are bonded by thermocompression, except that the adhesive layers 60 are only used between the upper sheet 13 and the board 21 and between the lower sheet 15 and the board 21. The unnecessary peripheral portion of the sheet-like structure is then cut to have the same size as that of the final product in the same manner as in the first embodiment. The thicknesses of the sheets are increased so as to have the same thickness as that of the sheet-like compact electronic calculator shown in FIG. 1. According to the fourth embodiment, most of the adhesive layers are omitted, thus greatly simplifying the manufacturing process.

Figure 30:
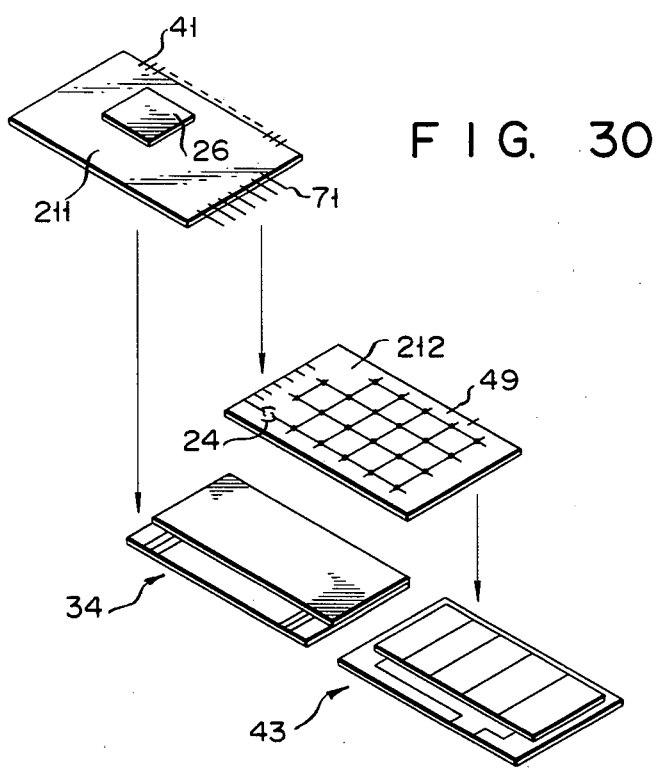
FIG. 30 is an exploded view showing another electronic parts assembly which differs from that shown in FIG. 3(b) and which is used for a sheet-like compact electronic calculator according to a fifth embodiment of the present invention.

A sheet-like compact electronic calculator according to a fifth embodiment of the present invention will be described with reference to FIG. 30. Referring to FIG. 30, the board 21 is divided into a board portion 211 for the integrated circuit element 26 and a board portion 212 for the stationary contacts 24. The board portions 211 and 212 are connected by terminals 71 formed on the board portion 211. According to the fifth embodiment, heat applied to the mounting process of the integrated circuit element 26 may not adversely affect any other element such as the stationary contacts 24. The board portions 211 and 212 may comprise any material which is suitable for the manufacturing conditions.

The upper cover 1 and the lower cover 2 will be described more in detail. In the sheet-like compact electronic calculator of the present invention, the upper cover 1 and the lower cover 2 are adhered to the upper and lower surfaces of the electronic parts assembly 11, respectively, so as to support the protect the electronic parts assembly 11. The upper cover 1 has the operation section 50 and the display window 53 and is adhered to the upper surface of the electronic parts assembly 11. The lower cover 2 is adhered as a sheet to the lower surface of the electronic parts assembly 11. The upper cover 1 comprises an integral sheet structure of the uppermost sheet 12 and the upper sheet 13 which latter serves as a switch spacer in the first embodiment. Similarly, the lower cover 2 comprises an integral sheet structure of the lowermost sheet 14 and the lower sheet 15.

The upper and lower covers 1 and 2 may comprise single sheets 72 and 73, respectively, as shown in the sheet-like structure of FIG. 31 according to the sixth embodiment of the present invention. FIG. 31 is a sectional view of the sheet-like structure obtained by stacking the sheets and cutting an unnecessary peripheral portion thereof to have the same size as that of the final product. In this case, the lower cover 2 (sheet 73) and a frame 161 are thick enough and are made of a rigid resin to assure good mechanical strength. A spacer 74 may be disposed in a position corresponding to the operation section 50 of the uppermost sheet 12. Alternatively, the upper cover 1 need not be made thin unlike the sixth embodiment shown in FIG. 31. A section of a sheet-like structure of the compact electronic calculator according to the seventh embodiment of the present invention is shown in FIG. 32, in which a sheet 75 of rigid PVC is formed to have a thick periphery. The sheet 75 is singly used as the upper cover 1. The sheets including the sheet 75 are stacked and adhered to each other in the same manner as in the first embodiment. Thereafter, an unnecessary peripheral portion is cut to form a sheet-like compact electronic calculator. In this case, only the operation section of the sheet 75 is made thin and a spacer is disposed thereunder to allow the user to press the key easily. In this manner, the upper cover 1 comprises only a single sheet having the operation section and the display window. Furthermore, a single sheet can be used as the lower cover 2. The sheets including the single sheet described above are stacked and adhered to each other and are cut to have the same size as that of the final product. As shown in the first embodiment, the upper cover 1 or the lower cover 2 may have a multi-layer structure having at least two sheets.

The frame will be described in detail hereinafter. The frame sandwiched between the upper cover 1 and the lower cover 2 fundamentally surrounds the electronic parts assembly 11 so as to protect it from external forces. In the first embodiment, the frame 16 is formed independently of the upper and lower covers 1 and 2, so that the frame 16 is sandwiched between the upper cover 1 and the lower cover 2. However, the present invention is not limited to the above structure. A peripheral frame portion may be formed on one of the upper cover 1 and the lower cover 2, or peripheral frame portions may be respectively formed on the upper cover 1 and the lower cover 2. The upper cover 1 is brought into tight contact with the lower cover 2 through any peripheral frame portion.

FIG. 33 is a sectional view of a sheet-like structure which constitutes a sheet-like compact electronic calculator according to an eighth embodiment of the present invention. A lower cover 2 is used in which a frame portion 162 is formed integrally with a sheet 76. The sheets including the sheet 76 are stacked and adhered to each other, and an unnecessary peripheral portion is cut to prepare the sheet-like compact electronic calculator. In the eighth embodiment, the upper cover 1 and the lower cover 2 are respectively made of sheets 72 and 76. The electronic parts assembly 11 is disposed in the recess surrounded by the frame portion 162 of the lower cover 2. The upper cover 1 (sheet 72) is brought into tight contact with the electronic parts assembly 11 and the frame portion 162.

FIG. 34 is a sectional view of a sheet-like structure which constitutes a sheet-like compact electronic calculator according a ninth embodiment of the present invention. In the ninth embodiment, frame portions are integral with the upper cover 1 and the lower cover 2, respectively. The sheets including the upper and lower covers with the frame portion are stacked and adhered to each other, and an unnecessary peripheral portion is cut to prepare the sheet-like compact electronic calculator in the same manner as in the first embodiment. A sheet 77 integrally having a frame portion 163 is used as the upper cover 1, and a sheet 78 integrally having a frame portion 164 is used as the lower cover 2. The frame portions 163 and 164 constitute a frame when the sheets 77 and 78 are laminated. The ninth embodiment exemplifies a structure in which the upper cover 1 is made of a single sheet, and the lower cover 2 is also made of a single sheet.

Sheet materials are not limited to the materials used in the above embodiments. A thin steel sheet may be used to improve the recovery force and the mechanical strength. Furthermore, the thicknesses of members such as sheets, and the connections of the board, the display element and the dry cell are not limited to the above embodiments. The dry cell is not limited to a solar cell, but may be extended to any thin dry cell. The operation section may not be limited to the arrangement shown in the above embodiments. The movable contacts may be replaced with pressure-sensitive rubbers. The present invention is not limited to a compact electronic calculator, but may be widely extended to sheet-like compact electronic equipment such as an electronic water and an electronic gate machine.

What we claim is:

1. A sheet-like compact electronic device, comprising:
   an electronic parts assembly including
   a flexible board including switching contacts and having a predetermined wiring pattern thereon,
   a semiconductor integrated circuit chip disposed on said board and electrically connected to said wiring pattern, a display unit disposed on said board and electrically connected to said semiconductor integrated circuit chip through said wiring pattern, said display unit being adapted to display data visually in accordance with an output signal from said semiconductor integrated circuit chip, and a dry cell disposed on said board and electrically connected to said semiconductor integrated circuit chip through said wiring pattern, said dry cell being adapted to apply a drive voltage across said semiconductor integrated circuit chip, and said display unit and said dry cell being connected to said flexible board such that they are substantially on the same plane with said flexible board; and case means comprising upper cover means made of a flexible material and in tight contact with an upper surface of said electronic parts assembly, said upper means being provided with a key indicia portion opposing said switching contacts on said board so as to allow an operator to perform a key operation, and with a transparent display window opposing said display section, lower cover means having a sheet-like flat lower surface, and in tight contact with a lower surface of said electronic parts assembly, and adhesive means provided between said upper cover means and said lower cover means for adhering the two together;

wherein said case means stores said electronic parts assembly therein such that said upper and said lower cover means sandwich said electronic parts assembly therebetween.

2. A sheet-like compact electronic device according to claim 1, wherein the thickest part of said electronic parts assembly is less than 0.6 mm, and the thinnest parts of said upper and lower cover means are adhered by said adhesive means to the thickest part of said electronic parts assembly to form a card with an overall uniform thickness of less than 1 mm.

3. A sheet-like compact electronic device according to claim 1, wherein said display unit comprises liquid crystal elements sandwiched between a pair of transparent high polymer film substrates, and said lower cover means has a concave portion for housing said display unit.

4. A sheet-like compact electronic device according to claim 1, wherein said dry cell comprises a flexible, flat member as a base member on top of which a solar cell member element and a pair of electrode terminals are formed together with a transparent, flat overcoat which covers said base member and said solar cell elements except for said pair of electrode terminals, and said pair of electrode terminals are connected to the wiring pattern of said flexible substrate through a flexible, conductive member by fastening said pair of electrode terminals to the flexible, conductive member.

5. A sheet-like compact electronic device according to claim 1, wherein said flexible board has attachment holes for housing said semiconductor integrated circuit chip and comprising an insulative, synthetic resin which covers said integrated circuit chips stored in said attachment holes.

6. A sheet-like compact electronic device according to claim 1, wherein said electronic parts assembly has a surface area smaller than a confronting surface of each of said upper cover means and said lower cover means, and comprising a frame which surrounds the outer periphery of said electronic parts assembly and which frame is located between said lower cover means and said upper cover means.

7. Electronic device according to claim 6, wherein said lower cover means is integrally formed with said frame.

8. Electronic device according to claim 7, wherein said lower cover means comprises a plurality of sheets which are tightly laminated, said plurality of sheets having a sheet which contacts a lower surface of said electronic parts assembly so as to constitute said frame which surrounds said electronic parts assembly.

9. Electronic device according to claim 6, wherein said upper cover means and said lower cover means are integrally formed with a part of said frame, respectively, said frame parts together being adapted to surround the outer periphery of said electronic parts assembly.

10. Electronic device according to claim 1, wherein said electronic parts assembly has a surface area smaller than a confronting surface of each of said upper cover means and said lower cover means and including a frame which surrounds said electronic parts assembly, said frame having a surface area such that a sum of said surface area of said frame and said surface area of said electronic parts assembly is substantially equal to said surface area of each of said upper cover means and said lower cover means, said frame being tightly sandwiched between said upper cover means and said lower cover means.

11. Electronic device according to claim 10, wherein said upper cover means comprises a plurality of sheets which are tightly laminated with each other.

12. Electronic device according to claim 11, wherein said upper cover means comprises two sheets which are tightly laminated with each other.

13. Electronic device according to claim 12, wherein said lower cover means comprises a plurality of sheets which are tightly laminated with each other.

14. Electronic device according to claim 10, wherein said lower cover means comprises two sheets which are tightly laminated with each other.

15. Electronic device according to claim 10, wherein said upper cover means and said lower cover means respectively comprise pluralities of sheets which are tightly laminated with each other.

16. Electronic device according to claim 10, wherein said upper cover means and said lower cover means respectively comprise sets of two sheets which are tightly laminated with each other.

* * * * *